(12) United States Patent
Chung et al.

(10) Patent No.: US 6,339,391 B1
(45) Date of Patent: Jan. 15, 2002

(54) METHOD AND APPARATUS FOR OPTIMIZING CROSSOVER VOLTAGE FOR DIFFERENTIAL PAIR SWITCHES IN A CURRENT-STEERING DIGITAL-TO-ANALOG CONVERTER OR THE LIKE

(75) Inventors: Tae-Song Chung, Danville; See-Hoi Caesar Wong, Fremont, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/459,507

(22) Filed: Dec. 13, 1999

(51) Int. Cl.[7] .................................................. H03M 1/82
(52) U.S. Cl. ........................................ 341/153; 341/144
(58) Field of Search ................................ 341/153, 144, 341/155, 136; 327/51, 67

(56) References Cited

U.S. PATENT DOCUMENTS

| | | | | |
|---|---|---|---|---|
| 4,866,674 A | * | 9/1989 | Tran ........................ | 365/189.11 |
| 5,019,789 A | * | 5/1991 | Graeme et al. ............. | 330/273 |
| 5,633,638 A | * | 5/1997 | Venes et al. ................ | 341/155 |
| 5,656,957 A | * | 8/1997 | Marlow et al. .............. | 327/67 |
| 5,949,362 A | * | 9/1999 | Tesch et al. ................ | 341/144 |
| 5,963,158 A | * | 10/1999 | Yasuda ....................... | 341/136 |
| 6,137,319 A | * | 10/2000 | Krishnamurthy et al. ..... | 327/51 |

FOREIGN PATENT DOCUMENTS

JP          401149605 A   *   6/1989

* cited by examiner

Primary Examiner—Peguy JeanPierre
Assistant Examiner—Jean Bruner Jeanglaude
(74) Attorney, Agent, or Firm—Suiter & Associates PC

(57) ABSTRACT

A method and apparatus for optimizing crossover voltage for differential pair switches in a current-steering digital-to-analog converter or the like are disclosed. An array of at least one or more MOSFET switches may be utilized to control the crossover voltage of a differential pair of transistors such that the off time overlap of the differential pair transistors is optimized. In one embodiment, the pull-up and pull-down times of the input for the differential pair transistors are optimized such that the differential pair transistors are not turned off simultaneously. The array of switches may be n-channel MOSFETs when the differential pair are p-channel MOSFETs. Likewise, the array of switches may be p-channel MOSFETs when the differential pair are n-channel MOSFETs. The output of the differential pair is free of crossover glitches and is capable of being utilized in a data converter such as a current-steering digital-to-analog converter (DAC).

20 Claims, 4 Drawing Sheets

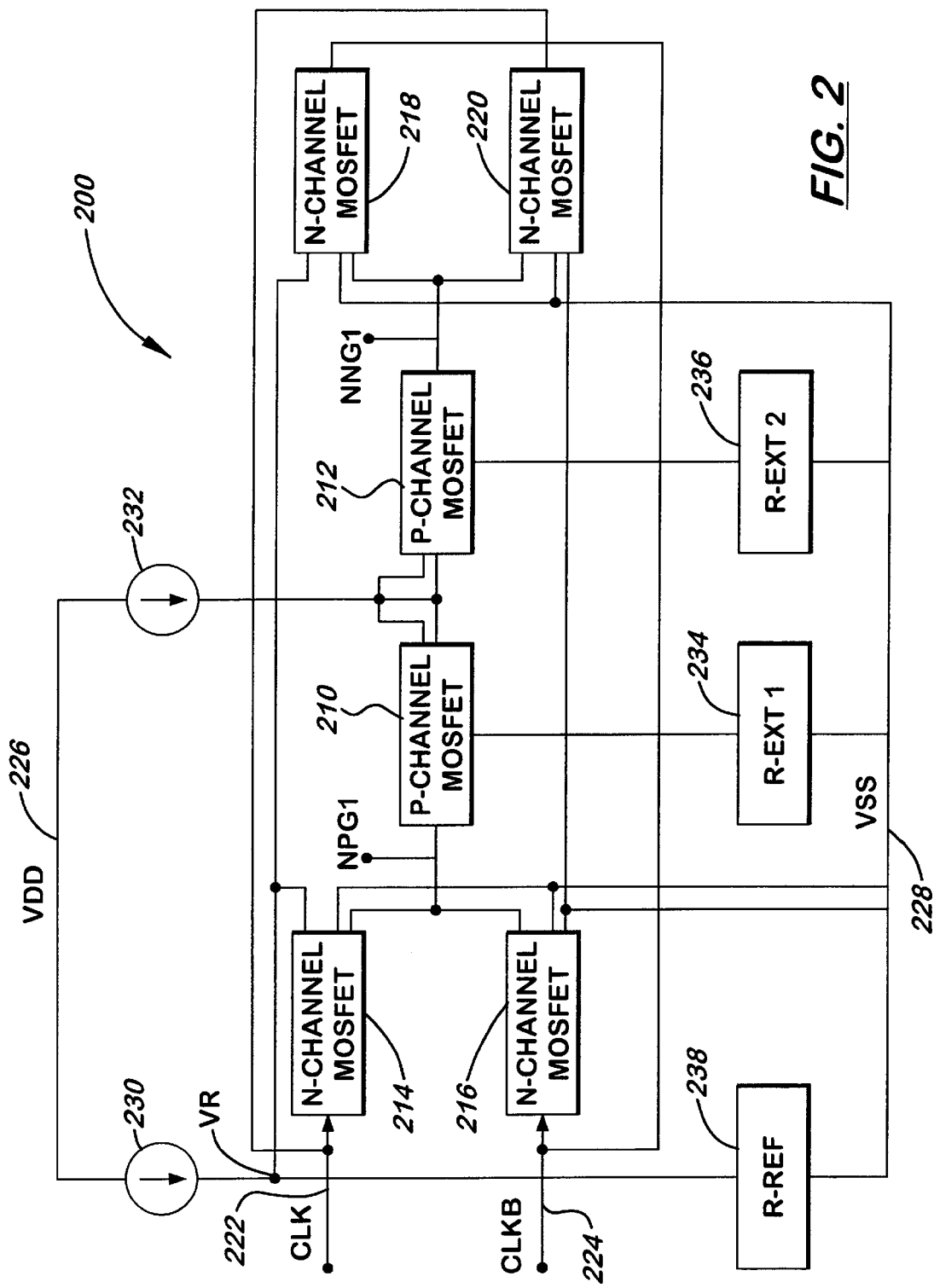

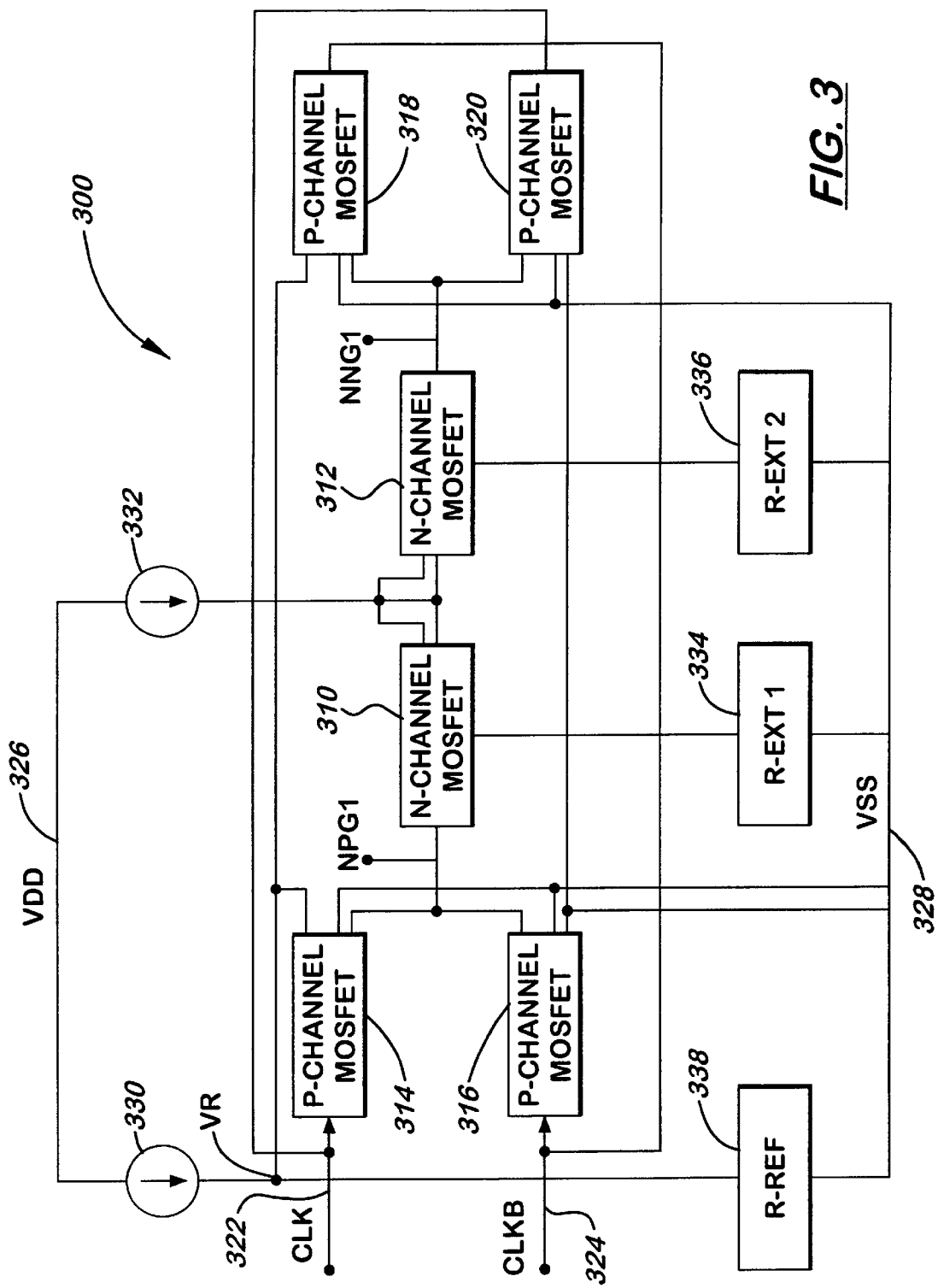

METHOD AND APPARATUS FOR OPTIMIZING CROSSOVER VOLTAGE FOR DIFFERENTIAL PAIR SWITCHES IN A CURRENT-STEERING DIGITAL-TO-ANALOG CONVERTER OR THE LIKE

BACKGROUND

The present invention relates generally to data conversion systems, and more particularly to digital-to-analog converters.

In data conversion system, it is desirable to reduce spurious voltages and currents so that the resulting output accurately represents the input value while minimizing any error. In a digital-to-analog converter (DAC) system, a differential transistor pair is utilized to provide control of a current source in converting a digital signal input into an analog output current or voltage. Where the transistors are metal oxide semiconductor field effect transistors (MOSFETs), output glitches may be reduced by ensuring that the transistors are not turned off simultaneously. Prior systems utilized inverters in an attempted to control the crossover voltages of the differential pair. However, using inverters is disadvantageous because inverter threshold variation over the process and temperature, must be adjusted, and is difficult to predict and account for. Additionally, inverters may produce unacceptable noise due to current spikes produced during state transitions. Thus, there lies a need for, inter alia, a method and apparatus for providing improved crossover voltage control of a differential pair.

BRIEF DESCRIPTION OF THE DRAWINGS

The numerous advantages of the present invention may be better understood by those skilled in the art by reference to the accompanying figures in which:

FIG. 2 is a diagram of a current-steering array element for a digital-to-analog converter in accordance with the present invention;

FIG. 3 is a diagram of an alternative current-steering array element for a digital-to-analog converter in accordance with the present invention.

DETAILED DESCRIPTION

Reference will now be made in detail to at least one or more embodiments of the invention, at least one or more examples of which are illustrated in the accompanying drawings.

Figure 1:
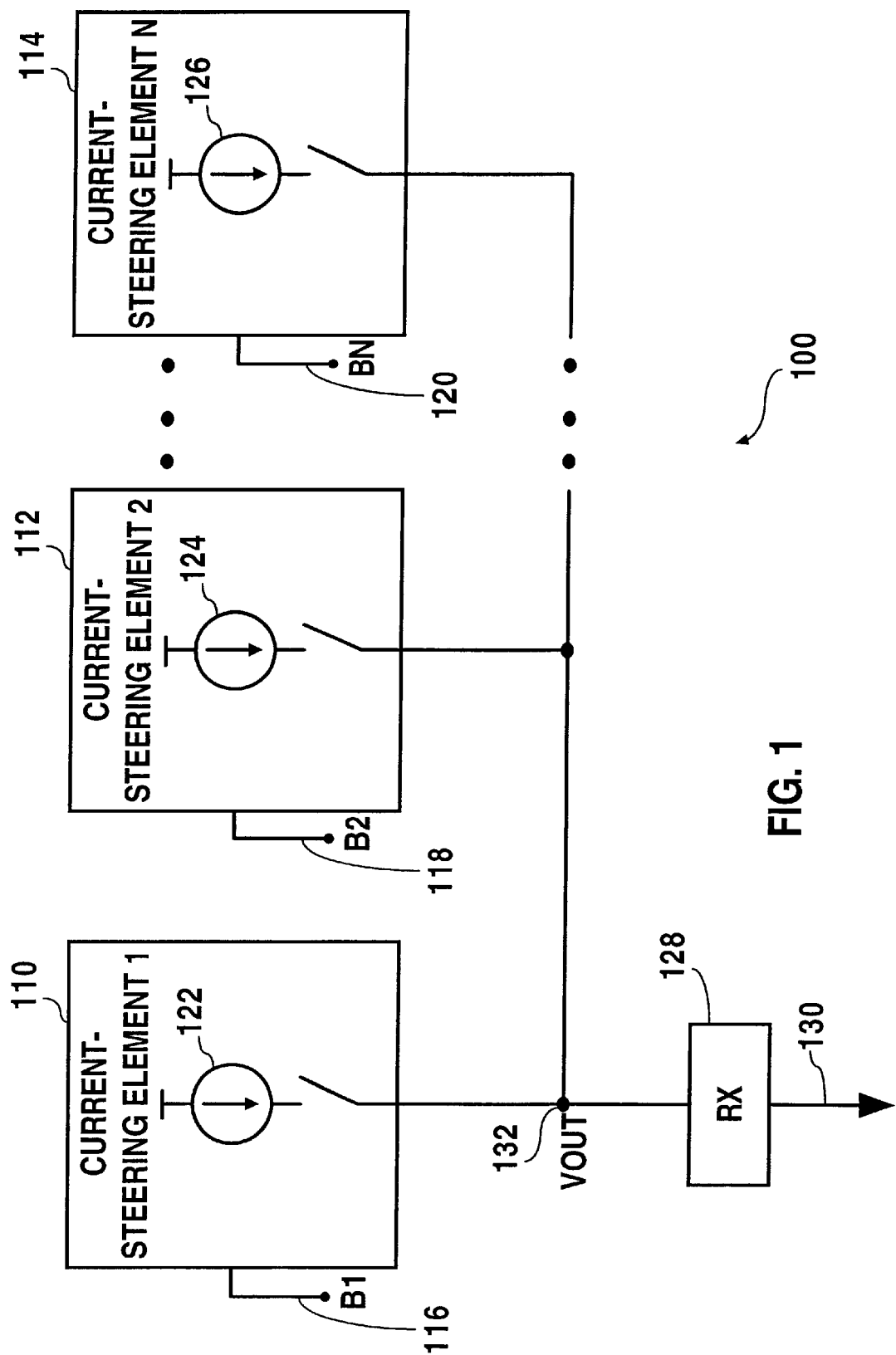
FIG. 1 is a diagram of a digital-to-analog converter in accordance with the present invention.

Referring now to FIG. 1, a digital-to-analog converter in accordance with the present invention will be discussed. Digital-to-analog converter (DAC) 100 may comprise an array of current-steering elements 110, 112, up to current-steering element 114, where the number of current steering elements, N, is equal to the number of bits in a digital input that DAC 100 is capable of converting into an analog signal. For example, in the case where DAC 100 is configured to convert a three-bit digital signal, N equals three. The number of bits, N, may range from 1 to infinity (i.e., open ended range with no upper limit). Each bit of the N-bit digital signal is applied to a respective input 116, 118, up to 120, of a corresponding one of current steering elements 110–114. For example, the first bit of the N-bit digital signal is applied at input 116 of current-steering element 110, the second bit is applied at input 118 of current-steering element 112, and the Nth bit is applied to input 120 of current-steering element 114. The application of a digital input signal at inputs 116–120 of current-steering elements 110–114 controls current internal sources 122, 124, up to 126 each associated with a respective one of current-steering elements 110–114. The bit value applied to a current steering element determines whether its corresponding current source 122 is switched to an OFF state or an ON state. Each of current sources 122–126 may provide a current having a respective constant current value based upon, for example, the significance of the bit applied to the input of its corresponding one of current-steering elements 110–114. For example, the least significant bit (LSB) of a digital input signal may be applied at input 116, the next most significant bit of the digital input signal may be applied at input 118, and the most significant bit (MSB) map be applied at input 120. In the case where DAC 100 is configured to receive a typical binary number, current element 122 may provide a current having a value of $2^0 I$, where I is a reference current value, current element 124 may provide a current having a value of $2^1 I$, and so on, and current element 126 may provide a current having a value of $2^{N-1} I$. As a result, the total current flowing into node 132 is the sum of currents provided by current elements 122–126. Other current-steering weighting schemes may also be used, for example, the digital input signal may be encoded in a thermometer code in which case all of current elements 122–126 may provide a current having the same constant current value. Other weighting schemes may be utilized with DAC 100 as known to those of skill in the art without departing from the scope of the invention.

The total current flowing into node 132 produces a proportional voltage across resistor (RX) 128 to provide an analog output voltage proportional to the value of a digital input signal applied at inputs 116–120 of DAC 100. The analog voltage produced across resistor is proportional to an output voltage (VOUT) 132 of DAC 100. Output voltage 132 may be measured with respect to a reference voltage 130 (e.g., ground). One of skill in the art would appreciate that other DAC types or configurations may be substituted for DAC 100 as shown in FIG. 1 without departing from the spirit and scope of the invention.

Referring now to FIG. 2, a diagram of a current-steering element capable of being utilized as a current-steering element of a digital-to-analog converter will be discussed. Current steering element 200 may be utilized, for example, as one of current-steering elements 110–114 of FIG. 1 considering that current-steering element 200 is fully differential. Current-steering element 200 includes a differential pair configuration of transistors 210 and 212. In the embodiment shown in FIG. 2, transistors 210 and 212 are p-channel MOSFETs. Transistors 214, 216, 218, and 220 are n-channel MOSFETs that control the operation of transistors 210 and 212 based upon input signals (CLK) 222 and (CLKB) 224. Input signals 222 and 224 are applied to the gates of transistors 214 and 220, and 216 and 218, respectively. The devices of current-steering element 200 receive power supply line voltages (VDD) 226 and (VSS) 228. Current source 230 applies a current to resistor 238 to provide a reference voltage to transistors 214–220, and current source 232 applies a current to external resistors 234 and 236 via transistors 210 and 212. External resistors (R-EXT1) 234 and (R-EXT2) 236 may be common for all of the current steering elements such as shown in FIG. 1 as resistor (RX) 128. In response to input signals applied to inputs 222 and 224, corresponding output signals are produced at nodes NPG1 and NNG1, which are electrically coupled to the gates of transistors 210 and 212, respectively.

In operation of current-steering element 200, overlap in the turn off times of transistors 210 and 212 is optimized. In one embodiment, a non-zero amount of turn off time overlap exists but is minimized. In an alternative embodiment, the pull-down time at nodes NPG1 and NNG1 to VSS 228 is faster than the pull-up time to reference voltage VR so that transistor 210 and 212 are not turned off simultaneously (i.e., no overlap in the turn off times of transistors 210 and 212). The difference between the pull-down time and the pull-up time thereby causes the crossover voltage at NPG1 and NNG1 to be shifted down as a result. Using MOSFETs 214–220 to control the crossover voltage of differential configured transistors 210 and 212 provides an improved signal-to-noise ratio at outputs 234 and 236, for example, in a current-steering operation in a digital-to-analog converter such as DAC 100. Furthermore, for the present invention, no inverter threshold adjustment is necessary, and a minimum switch size of transistors 214–220 may be employed which provides less charge injection into transistors 210 and 212. In addition, utilization of transistors 214–216 provides less bus bounce on power supply voltage lines 226 and 228 due to controlled current operation. One having skill in tile art would appreciate that other types of electron devices or control devices may be substituted for transistors 210–220, for example, bias-junction transistors (BJTs) without deviating from the scope of the invention.

FIG. 3 is a diagram of a current-steering element capable of being utilized as a current-steering element of a digital-to-analog converter in accordance with the present invention. Current-steering element 300 of FIG. 3 is substantially similar to current-steering element 200 of FIG. 2 except that in FIG. 2 transistors 210 and 212 are p-channel MOSFETs whereas in FIG. 3 transistors 310 and 312 are n-channel MOSFETs. Likewise, in FIG. 2, transistors 214, 216, 218, and 220 arc n-channel MOSFETs whereas in FIG. 3 transistors 314, 316, 318, and 320 are p-channel MOSFETs. One having skill in the art would appreciate that other types of transistors and configurations may be substituted without departing from the scope of the invention.

Figure 4A:
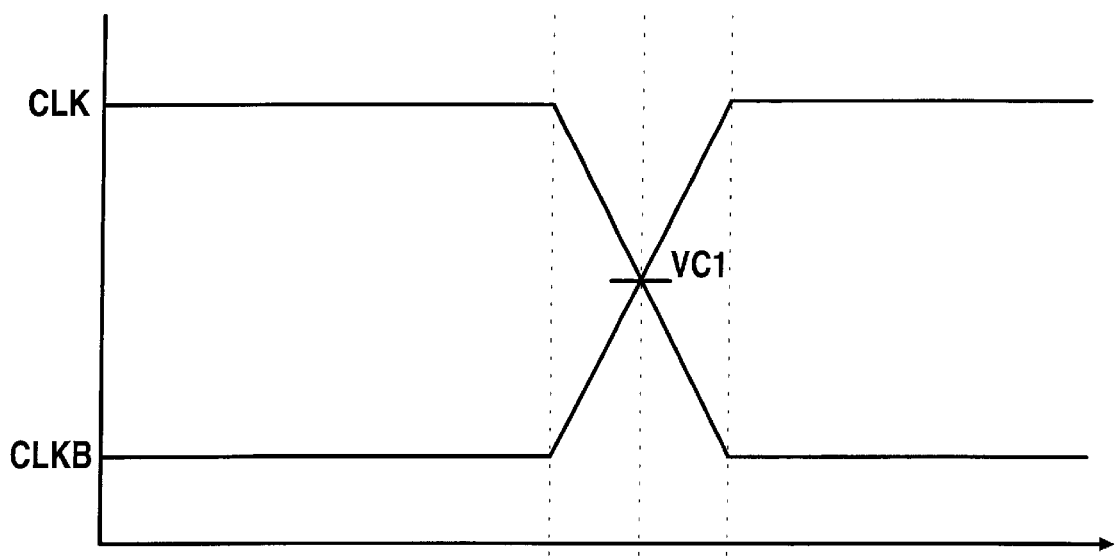
FIG. 4A is a timing diagram which depicts the exemplary operation of input signal CLK and input signal CLKB of the current steering elements shown in FIGS. 2 and 3 in accordance with the present invention.
Figure 4B:
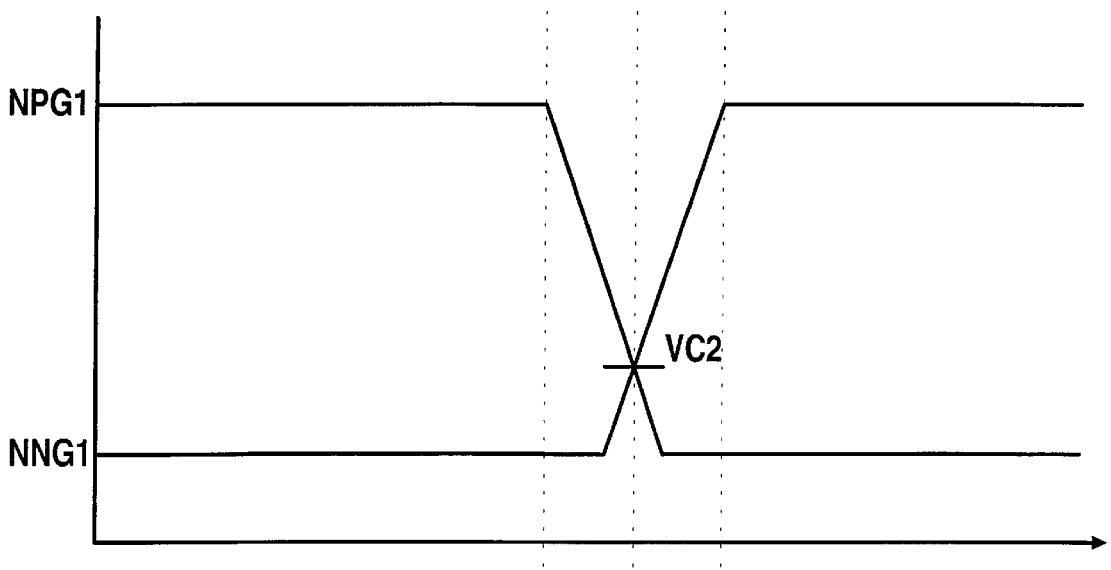
FIG. 4B is a timing diagram which depicts exemplary operation of output signals NPG1 and NNG of current steering elements shown in FIGS. 2 and 3 in accordance with the present invention.

Referring now to FIG. 4A, a timing diagram depicts the exemplary operation of input signal CLK and input signal CLKB in comparison with FIG. 4B which is a timing diagram depicting exemplary operation of output signals NPG1 and NNG1 of the current steering elements shown in FIGS. 2 and 3. In FIGS. 4A and 4B, the vertical axes represent voltage, and the horizontal axes represent time. As shown in FIG. 4A, in operation of the present invention as input signal CLK falls over time, input signal CLKB rises over time. Simultaneously, in FIG. 4B, output voltage NPG1 falls as output voltage NNG1 rises with respect to time. At the point in time at which input signals CLK and CLKB have the same value, crossover voltage VC1 represents a first voltage value. At the point in time at which output signals NPG1 and NNG1 have the same value, crossover voltage VC2 represents a second voltage value. As can be seen in FIGS. 4A and 4B, crossover voltage VC2 is at a value such that transistors 210 and 212 of FIG. 2 and are not turned off at the same time, thereby reducing or avoiding current or voltage glitches in the output voltage across resistors R-EXT1 and R-EXT2 in FIG. 2. For transistors 310 and 312 of FIG. 3, the same principle applies but VC2 is skewed in the opposite direction (i.e., VC2 is greater than VC1). Although not shown, these results are also achieved as CLK rises and CLKB falls over time, and as NPG1 rises and NNG1 falls over time.

It is believed that the method and apparatus for optimizing crossover voltage for differential pair switches in a current-steering digital-to-analog converter or the like of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An apparatus, comprising:
    a differential pair of transistors for providing an output in response to an input wherein a crossover voltage is produced, each of said differential pair of transistors having an off time; and
    an array of at least one or more transistors coupled to said differential pair of transistors, said array of at least one or more transistors controlling the crossover voltage of said differential pair of transistors such that an overlap of the off time of said differential pair of transistors is optimized.

2. An apparatus as claimed in claim 1, at least one of said differential pair of transistors comprising a p-channel MOSFET.

3. An apparatus as claimed in claim 1, at least one of said differential pair of transistors comprising an n-channel MOSFET.

4. An apparatus as claimed in claim 1, at least one of said array of at least one or more transistors comprising an n-channel MOSFET.

5. An apparatus as claimed in claim 1, at least one of said array of at least one or more transistors comprising a p-channel MOSFET.

6. An apparatus as claimed in claim 1, at least one of said differential pair of transistors comprising a p-channel MOSFET and at least one of said array of at least one or more transistors comprising an n-channel MOSFET.

7. An apparatus as claimed in claim 1, at least one of said differential pair of transistors comprising an n-channel MOSFET and at least one of said array of at least one or more transistors comprising a p-channel MOSFET.

8. An apparatus, comprising:
    means for providing an output in response to an input whereby a crossover voltage is produced; and
    means, coupled to said output providing means, for controlling the crossover voltage of said output providing means such that undesirable content in the output is reduced.

9. An apparatus as claimed in claim 8, the output having a pull-up time and a pull-down time, said controlling means for providing a difference between the pull-up time and the pull-down time.

10. An apparatus as claimed in claim 8, the output of said output providing means being a current produced in response to the input.

11. An apparatus as claimed in claim 8, the input being a voltage applied to said controlling means.

12. An apparatus as claimed in claim 8, the input being a voltage applied to said controlling means and the output of said output means being a current produced in response to the input.

13. A digital-to-analog converter, comprising:

at least one or more current-steering elements, each of said at least one or more current-steering elements receiving, one bit of a digital input signal, one bit per each of said at least one or more current-steering elements, each of said at least one or more current-steering elements comprising a differential pair of transistors for providing an output in response to an input whereby a crossover voltage may be produced, each of said differential pair of transistors having an off time, and an array of at least one or more transistors coupled to said differential pair of transistors, said array of at least one or more transistors controlling the crossover voltage of said differential pair of transistors such that an overlap in the off time of each of said differential pair transistors is optimized; and at least one or more current sources coupled to and controlled by a respective one of said at least one or more current-steering elements, each of said at least one or more current sources providing an output current having a value corresponding to the received bit of the respective at least one or more current-steering elements according to the digital input signal such that a sum of the provided output current of each of said at least one or more current sources provides an analog output proportional to a value of the digital input signal.

14. A digital-to-analog converter as claimed in claim 13, at least one of said differential pair of transistors comprising a p-channel MOSFET and at least one of said array of at least one or more transistors comprising an n-channel MOSFET.

15. A digital-to-analog converter as claimed in claim 13, at least one of said differential pair of transistors comprising an n-channel MOSFET and at least one of said array of at least one or more transistors comprising a p-channel MOSFET.

16. A method, comprising:

receiving an input signal with a differential pair of transistors for producing a crossover voltage and for providing an output in response to the input, each of the differential pair of transistors having an off time; and controlling the application of the input signal to differential pair of transistors such that an overlap of the off times of the differential pair of transistors is optimized.

17. A method as claimed in claim 16, said controlling step including the step of applying the input signal with at least one or more n-channel MOSFETs.

18. An apparatus as claimed in claim 1, said controlling step including the step of applying the input signal with at least one or more p-channel MOSFETs.

19. An apparatus as claimed in claim 1, at least one of the differential pair of transistors comprising a p-channel MOSFET, said controlling, step including the step of applying the input signal with at least one or more n-channel MOSFETs.

20. An apparatus as claimed in claim 1, at least one of the differential pair of transistors comprising an n-channel MOSFET, said controlling step including the step of applying the input signal with at least one or more p-channel MOSFETs.

* * * * *